United States Patent
Loh et al.

(10) Patent No.: US 9,431,589 B2
(45) Date of Patent: Aug. 30, 2016

(54) TEXTURED ENCAPSULANT SURFACE IN LED PACKAGES

(75) Inventors: Ban P. Loh, Durham, NC (US); Chenhua You, Cary, NC (US); Bernd Keller, Santa Barbara, CA (US); Nathaniel O. Cannon, Morrisville, NC (US); Mitch Jackson, Raleigh, NC (US); Ernest W. Combs, Raleigh, NC (US)

(73) Assignee: CREE, INC., Goleta, CA (US)

( * ) Notice: Subject to any disclaimer, the term of this patent is extended or adjusted under 35 U.S.C. 154(b) by 0 days.

(21) Appl. No.: 12/002,429

(22) Filed: Dec. 14, 2007

(65) Prior Publication Data

US 2009/0152573 A1    Jun. 18, 2009

(51) Int. Cl.
*H01L 33/54*    (2010.01)
*H01L 25/075*    (2006.01)

(52) U.S. Cl.
CPC .......... *H01L 33/54* (2013.01); *H01L 25/0753* (2013.01); *H01L 2924/0002* (2013.01); *H01L 2933/0091* (2013.01)

(58) Field of Classification Search
USPC .......... 257/729, 79, 82, 95, 98, 99; 313/512; 438/26; 362/231, 237, 373
See application file for complete search history.

(56) References Cited

U.S. PATENT DOCUMENTS

| | | | |
|---|---|---|---|
| 4,346,275 A | 8/1982 | Iwakiri | |
| 4,476,620 A | 10/1984 | Ohki et al. | 438/33 |
| 4,865,685 A | 9/1989 | Palmour | 156/643 |
| 4,902,356 A | 2/1990 | Noguchi et al. | 148/33.4 |
| 4,912,532 A | 3/1990 | Cook et al. | 357/16 |
| 4,946,547 A | 8/1990 | Palmour et al. | 156/643 |
| 4,981,551 A | 1/1991 | Palmour | 156/643 |
| 5,087,949 A | 2/1992 | Haitz et al. | 357/17 |
| 5,094,185 A | 3/1992 | Simopoulos et al. | |
| 5,103,271 A | 4/1992 | Izumiya et al. | 357/17 |
| 5,200,022 A | 4/1993 | Kong et al. | 156/612 |
| 5,226,052 A | 7/1993 | Tanaka et al. | 372/36 |

(Continued)

FOREIGN PATENT DOCUMENTS

| | | |
|---|---|---|
| CN | 2535926 | 12/2003 |
| CN | 1492521 A | 4/2004 |

(Continued)

OTHER PUBLICATIONS

Decision of Rejection from Japanese Patent Appl. No. 2013-509039, dated Oct. 7, 2014.

(Continued)

*Primary Examiner* — Errol Fernandes
(74) *Attorney, Agent, or Firm* — Koppel, Patrick, Heybl & Philpott

(57) ABSTRACT

A packaged LED device having a textured encapsulant that is conformal with a mount surface on which at least one LED chip is disposed. The textured encapsulant, which can be textured using an additive or subtractive process, is applied to the LED either prior to or during packaging. The encapsulant includes at least one textured surface from which light is emitted. The textured surface helps to reduce total internal reflection within the encapsulant, improving the extraction efficiency and the color temperature uniformity of the output profile. Several chips can be mounted beneath a single textured encapsulant. A mold having irregular surfaces can be used to form multiple encapsulants over many LEDs simultaneously.

28 Claims, 3 Drawing Sheets

(56) References Cited

U.S. PATENT DOCUMENTS

| | | | |
|---|---|---|---|
| 5,376,241 A | 12/1994 | Shor et al. | 204/129.3 |
| 5,376,580 A | 12/1994 | Kish et al. | 437/127 |
| RE34,861 E | 2/1995 | Davis et al. | 437/100 |
| 5,453,405 A | 9/1995 | Fan et al. | 438/34 |
| 5,502,316 A | 3/1996 | Kish et al. | 257/94 |
| 5,549,762 A | 8/1996 | Cantarini | 136/249 |
| 5,614,734 A | 3/1997 | Guido | 257/94 |
| 5,644,156 A | 7/1997 | Suzuki et al. | 257/485 |
| 5,803,579 A | 9/1998 | Turnbull et al. | |
| 5,847,507 A | 12/1998 | Butterworth et al. | 313/512 |
| 5,939,732 A | 8/1999 | Kurtz et al. | 257/77 |
| 5,959,316 A | 9/1999 | Lowery | 257/98 |
| 5,985,687 A | 11/1999 | Bowers et al. | 438/46 |
| 6,066,861 A | 5/2000 | Hohn et al. | 257/99 |
| 6,071,795 A | 6/2000 | Cheung et al. | 438/458 |
| 6,091,084 A | 7/2000 | Fujii | 257/82 |
| 6,132,072 A | 10/2000 | Turnbull et al. | |
| 6,144,536 A | 11/2000 | Zimmerman et al. | |
| 6,160,834 A | 12/2000 | Scott | 372/96 |
| 6,212,213 B1 | 4/2001 | Weber et al. | |
| 6,222,207 B1 | 4/2001 | Carter-Coman et al. | 257/98 |
| 6,225,647 B1 | 5/2001 | Kurtz et al. | 257/94 |
| 6,234,648 B1 | 5/2001 | Borner et al. | |
| 6,258,699 B1 | 7/2001 | Chang et al. | 438/458 |
| 6,274,924 B1 | 8/2001 | Carey et al. | 257/676 |
| 6,303,405 B1 | 10/2001 | Yoshida et al. | 438/46 |
| 6,346,771 B1 | 2/2002 | Salam | 313/499 |
| 6,350,041 B1 | 2/2002 | Tarsa et al. | 362/231 |
| 6,365,429 B1 | 4/2002 | Kneissl et al. | 438/46 |
| 6,375,340 B1 | 4/2002 | Biebl | |
| 6,395,572 B1 | 5/2002 | Tsutsui et al. | 438/46 |
| 6,410,942 B1 | 6/2002 | Thibeault et al. | 257/88 |
| 6,420,199 B1 | 7/2002 | Coman et al. | 438/22 |
| 6,420,242 B1 | 7/2002 | Cheung et al. | 438/458 |
| 6,429,460 B1 | 8/2002 | Chen et al. | 257/79 |
| 6,448,102 B1 | 9/2002 | Kneissl et al. | 438/46 |
| 6,455,340 B1 | 9/2002 | Chua et al. | 438/31 |
| 6,465,809 B1 | 10/2002 | Furukawa et al. | 257/94 |
| 6,468,824 B2 | 10/2002 | Chen et al. | 438/46 |
| 6,480,389 B1 | 11/2002 | Shie | |
| 6,486,499 B1 | 11/2002 | Krames et al. | 257/81 |
| 6,489,637 B1 | 12/2002 | Sakamoto | |
| 6,495,862 B1 | 12/2002 | Okazaki et al. | 257/103 |
| 6,513,949 B1 | 2/2003 | Marshall et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,559,075 B1 | 5/2003 | Kelly et al. | 438/795 |
| 6,562,648 B1 | 5/2003 | Wong et al. | 438/46 |
| 6,576,930 B2 | 6/2003 | Reeh et al. | 257/98 |
| 6,577,073 B2 | 6/2003 | Shimizu et al. | 315/246 |
| 6,607,931 B2 | 8/2003 | Streubel | 438/22 |
| 6,610,598 B2 | 8/2003 | Chen | |
| 6,642,652 B2 | 11/2003 | Collins et al. | 313/512 |
| 6,657,236 B1 | 12/2003 | Thibeault et al. | 257/98 |
| 6,677,173 B2 | 1/2004 | Ota | 438/22 |
| 6,686,676 B2 | 2/2004 | McNulty et al. | 323/112 |
| 6,692,136 B2 | 2/2004 | Marshall et al. | |
| 6,707,247 B2 | 3/2004 | Murano | |
| 6,716,654 B2 | 4/2004 | Hsu et al. | 438/22 |
| 6,734,467 B2 | 5/2004 | Schlereth et al. | 257/89 |
| 6,740,604 B2 | 5/2004 | Kelly et al. | 438/795 |
| 6,741,029 B2 | 5/2004 | Matsubara | |
| 6,744,073 B1 | 6/2004 | Nakata | 257/81 |
| 6,757,314 B2 | 6/2004 | Kneissl et al. | 372/50 |
| 6,784,460 B2 | 8/2004 | Ng et al. | 257/95 |
| 6,784,463 B2 | 8/2004 | Camras et al. | |
| 6,786,390 B2 | 9/2004 | Yang et al. | 228/179.1 |
| 6,791,119 B2 | 9/2004 | Slater et al. | 257/99 |
| 6,791,259 B1 | 9/2004 | Stokes | |
| 6,797,987 B2 | 9/2004 | Chen | 257/98 |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,809,347 B2 | 10/2004 | Tasch et al. | |
| 6,817,735 B2 | 11/2004 | Shimizu et al. | |
| 6,821,804 B2 | 11/2004 | Thibeault et al. | 438/29 |
| 6,828,596 B2 | 12/2004 | Steigerwald et al. | 257/99 |
| 6,841,804 B1 | 1/2005 | Chen et al. | |
| 6,841,808 B2 | 1/2005 | Shibata et al. | 257/190 |
| 6,846,686 B2 | 1/2005 | Saeki et al. | 438/22 |
| 6,849,878 B2 | 2/2005 | Bader et al. | 257/103 |
| 6,869,812 B1 | 3/2005 | Liu | |
| 6,870,311 B2 | 3/2005 | Mueller et al. | 313/491 |
| 6,884,647 B2 | 4/2005 | Sakai et al. | 438/30 |
| 6,900,473 B2 | 5/2005 | Yoshitake et al. | 257/95 |
| 6,914,267 B2 | 7/2005 | Fukasawa et al. | |
| 6,936,857 B2 | 8/2005 | Doxsee et al. | |
| 6,946,309 B2 | 9/2005 | Camras et al. | 438/26 |
| 6,953,255 B2 | 10/2005 | Horiuchi | |
| 6,972,438 B2 | 12/2005 | Li et al. | 257/98 |
| 7,005,679 B2 | 2/2006 | Tarsa et al. | 257/89 |
| 7,008,078 B2 | 3/2006 | Shimizu et al. | |
| 7,009,199 B2 | 3/2006 | Hall | 257/14 |
| 7,009,215 B2 | 3/2006 | D'Evelyn et al. | 257/98 |
| 7,014,336 B2 | 3/2006 | Ducharme et al. | |
| 7,015,511 B2 | 3/2006 | Sakai et al. | 257/94 |
| 7,066,623 B2 | 6/2006 | Lee et al. | |
| 7,066,626 B2 | 6/2006 | Omata | |
| 7,084,557 B2 | 8/2006 | Mishima | 313/25 |
| 7,091,653 B2 | 8/2006 | Ouderkirk et al. | 313/113 |
| 7,095,056 B2 | 8/2006 | Vitta et al. | |
| 7,126,274 B2 | 10/2006 | Shimizu et al. | 313/512 |
| 7,132,691 B1 | 11/2006 | Tanabe et al. | 257/79 |
| 7,154,125 B2 | 12/2006 | Koide et al. | 257/95 |
| 7,213,940 B1 | 5/2007 | Van De Ven et al. | |
| 7,244,630 B2 | 7/2007 | Krames et al. | 438/47 |
| 7,256,480 B2 | 8/2007 | Hung et al. | 257/666 |
| 7,258,816 B2 | 8/2007 | Tamaki et al. | 252/301.4 F |
| 7,348,212 B2 | 3/2008 | Schiaffino et al. | 438/106 |
| 7,364,338 B2 | 4/2008 | Chang | 362/612 |
| 7,633,097 B2 | 12/2009 | Kim et al. | |
| 7,649,209 B2 | 1/2010 | Hussell et al. | 257/98 |
| 7,709,282 B2 | 5/2010 | Fukshima et al. | 438/26 |
| 7,869,483 B2 | 1/2011 | Uchida et al. | 372/99 |
| 8,328,376 B2 | 12/2012 | Negley et al. | |
| 8,896,197 B2 | 11/2014 | Negley | 313/501 |
| 2001/0000622 A1 | 5/2001 | Reeh et al. | 257/98 |
| 2002/0001192 A1 | 1/2002 | Suehiro et al. | 362/240 |
| 2002/0028527 A1 | 3/2002 | Maeda et al. | |
| 2002/0070681 A1 | 6/2002 | Shimizu et al. | 315/246 |
| 2002/0123164 A1 | 9/2002 | Slater et al. | 438/39 |
| 2002/0139990 A1 | 10/2002 | Suehiro et al. | |
| 2002/0140880 A1 | 10/2002 | Weindorf et al. | 349/70 |
| 2002/0153835 A1 | 10/2002 | Fujiwara et al. | |
| 2002/0163302 A1 | 11/2002 | Nitta et al. | |
| 2002/0180351 A1 | 12/2002 | McNulty | |
| 2002/0185966 A1 | 12/2002 | Murano | 313/501 |
| 2003/0025449 A1 | 2/2003 | Rossner | |
| 2003/0030063 A1 | 2/2003 | Sosniak et al. | 257/89 |
| 2003/0124752 A1 | 7/2003 | Wei et al. | |
| 2003/0146411 A1 | 8/2003 | Srivastava et al. | |
| 2003/0151361 A1* | 8/2003 | Ishizaka | 313/512 |
| 2003/0168670 A1 | 9/2003 | Roberts et al. | 257/98 |
| 2003/0173602 A1 | 9/2003 | Hsu et al. | |
| 2003/0189217 A1* | 10/2003 | Imai | 257/99 |
| 2003/0209714 A1 | 11/2003 | Taskar et al. | |
| 2003/0230751 A1 | 12/2003 | Harada | |
| 2004/0028097 A1 | 2/2004 | Miyabe et al. | |
| 2004/0033638 A1 | 2/2004 | Bader et al. | |
| 2004/0070004 A1 | 4/2004 | Eliashevich et al. | |
| 2004/0072382 A1 | 4/2004 | Kelly et al. | |
| 2004/0105261 A1 | 6/2004 | Ducharme et al. | |
| 2004/0119083 A1 | 6/2004 | Su et al. | 257/98 |
| 2004/0144987 A1 | 7/2004 | Ouderkirk et al. | 257/98 |
| 2004/0188697 A1 | 9/2004 | Brunner et al. | |
| 2004/0212998 A1 | 10/2004 | Mohacsi | |
| 2004/0217364 A1 | 11/2004 | Tarsa et al. | |
| 2004/0222435 A1 | 11/2004 | Shimizu et al. | 257/100 |
| 2004/0239243 A1 | 12/2004 | Roberts et al. | 313/512 |
| 2004/0245543 A1 | 12/2004 | Yoo | 257/103 |
| 2005/0077531 A1 | 4/2005 | Kim | |
| 2005/0082562 A1 | 4/2005 | Ou et al. | 257/103 |
| 2005/0082974 A1 | 4/2005 | Fukasawa et al. | |

(56) References Cited

U.S. PATENT DOCUMENTS

| | | | |
|---|---|---|---|
| 2005/0104080 A1 | 5/2005 | Ichihara | |
| 2005/0121688 A1 | 6/2005 | Nagai et al. | |
| 2005/0184298 A1 | 8/2005 | Ueda | 257/79 |
| 2005/0205974 A1 | 9/2005 | Su et al. | |
| 2005/0221519 A1 | 10/2005 | Leung et al. | 438/27 |
| 2005/0224821 A1 | 10/2005 | Sakano | |
| 2005/0227379 A1 | 10/2005 | Donofrio | |
| 2005/0242364 A1 | 11/2005 | Moustakas et al. | 257/103 |
| 2005/0248271 A1 | 11/2005 | Ng et al. | |
| 2005/0253158 A1 | 11/2005 | Yasukawa et al. | 257/98 |
| 2005/0285130 A1 | 12/2005 | Hsieh | |
| 2006/0002101 A1 | 1/2006 | Wheatley et al. | |
| 2006/0006404 A1* | 1/2006 | Ibbetson et al. | 257/99 |
| 2006/0011935 A1 | 1/2006 | Krames et al. | 257/99 |
| 2006/0012989 A1 | 1/2006 | Lee | |
| 2006/0060888 A1 | 3/2006 | Kim et al. | |
| 2006/0063289 A1 | 3/2006 | Negley | |
| 2006/0081869 A1 | 4/2006 | Lu et al. | |
| 2006/0105482 A1 | 5/2006 | Alferink et al. | |
| 2006/0105485 A1 | 5/2006 | Basin et al. | 438/27 |
| 2006/0145170 A1 | 7/2006 | Cho | |
| 2006/0154392 A1 | 7/2006 | Tran et al. | |
| 2006/0255341 A1 | 11/2006 | Pinnington et al. | 257/79 |
| 2006/0255347 A1 | 11/2006 | Thibeault et al. | 257/79 |
| 2006/0273335 A1 | 12/2006 | Asahara | |
| 2006/0284207 A1* | 12/2006 | Park et al. | 257/99 |
| 2007/0057271 A1 | 3/2007 | Schiaffino et al. | |
| 2007/0080337 A1 | 4/2007 | Sorg | 257/13 |
| 2007/0200127 A1 | 8/2007 | Andrews et al. | |
| 2007/0215890 A1 | 9/2007 | Harbers et al. | |
| 2007/0262338 A1 | 11/2007 | Higashi et al. | |
| 2007/0262339 A1 | 11/2007 | Hussell | 257/99 |
| 2007/0295968 A1* | 12/2007 | Tan et al. | 257/79 |
| 2008/0042151 A1* | 2/2008 | Oh et al. | 257/88 |
| 2008/0048200 A1 | 2/2008 | Mueller et al. | |
| 2008/0217635 A1 | 9/2008 | Emerson | |
| 2008/0296589 A1* | 12/2008 | Speier et al. | 257/82 |
| 2008/0308825 A1* | 12/2008 | Chakraborty et al. | 257/98 |
| 2009/0278148 A1 | 11/2009 | Nabekura et al. | 257/98 |
| 2012/0132937 A1 | 5/2012 | Chang | 257/89 |

FOREIGN PATENT DOCUMENTS

| | | | |
|---|---|---|---|
| CN | 1624944 | 6/2005 | |
| CN | 101366126 | 2/2009 | |
| CN | 101405646 | 4/2009 | |
| CN | 101553936 | 10/2009 | |
| CN | 101636851 | 1/2010 | |
| EP | 0684648 | 11/1995 | |
| EP | 1059678 A2 | 3/2000 | |
| EP | 1 059 678 A2 | 12/2000 | |
| EP | 1059667 | 12/2000 | |
| EP | 1059667 A2 | 12/2000 | |
| EP | 1156020 A1 | 11/2001 | |
| EP | 1168902 A2 | 1/2002 | H05K 5/00 |
| EP | 1246266 A2 | 2/2002 | |
| EP | 11980162 A2 | 4/2002 | |
| EP | 1246266 | 10/2002 | |
| EP | 1263058 A | 12/2002 | |
| EP | 1345275 A | 9/2003 | |
| EP | 1641049 A1 | 3/2006 | |
| GB | 1376086 | 12/1974 | |
| GB | 2282700 A | 4/1995 | |
| JO | 440555 | 4/1992 | |
| JP | 5371375 | 11/1951 | |
| JP | 508494 | 1/1975 | |
| JP | S 50-8494 | 1/1975 | |
| JP | 5298384 | 7/1977 | |
| JP | S0106175 | 6/1985 | |
| JP | 61032483 | 2/1986 | |
| JP | 61059886 | 3/1986 | |
| JP | 6194362 | 6/1986 | |
| JP | 6214481 | 1/1987 | |
| JP | 62143942 | 9/1987 | |
| JP | 646038 | 1/1989 | |
| JP | S61144890 | 7/1989 | |
| JP | 01230274 | 9/1989 | |
| JP | H01139664 | 9/1989 | |
| JP | 01287973 | 11/1989 | |
| JP | 03035568 | 2/1991 | |
| JP | 03187229 | 8/1991 | |
| JP | 04028269 | 1/1992 | H01L 33/00 |
| JP | 04028269 | 3/1992 | |
| JP | 04313281 | 11/1992 | |
| JP | 05327012 | 12/1993 | |
| JP | 06104463 | 4/1994 | |
| JP | H06177427 | 6/1994 | |
| JP | 06275866 | 9/1994 | |
| JP | 07007180 | 1/1995 | |
| JP | 08213660 | 8/1996 | |
| JP | 8314395 | 11/1996 | |
| JP | 09083018 | 3/1997 | |
| JP | H09138402 | 5/1997 | |
| JP | 09-153646 | 6/1997 | |
| JP | 09181359 | 7/1997 | |
| JP | 10012929 A | 1/1998 | |
| JP | 10-163535 | 6/1998 | |
| JP | 10190065 | 7/1998 | |
| JP | H10190065 | 7/1998 | |
| JP | 10233532 | 9/1998 | |
| JP | 10312990 | 11/1998 | |
| JP | 11026808 | 1/1999 | |
| JP | H11177129 | 7/1999 | |
| JP | 11238913 | 8/1999 | |
| JP | 11284234 | 10/1999 | |
| JP | 11-307813 | 11/1999 | |
| JP | 2000315826 | 11/2000 | |
| JP | 2000-353826 | 12/2000 | |
| JP | 2000353826 A | 12/2000 | |
| JP | 2001000043 | 1/2001 | |
| JP | 2001177153 | 6/2001 | |
| JP | 2001203396 | 7/2001 | |
| JP | 2001217467 | 8/2001 | |
| JP | 2002-57376 | 2/2002 | |
| JP | 2002076443 | 3/2002 | |
| JP | 2002100609 | 4/2002 | |
| JP | 2002111065 | 4/2002 | |
| JP | 2002141556 | 5/2002 | |
| JP | 2002203989 | 7/2002 | |
| JP | 2002520823 | 7/2002 | |
| JP | 2002217450 | 8/2002 | |
| JP | 2002270515 | 8/2002 | |
| JP | 2002261333 | 9/2002 | |
| JP | 2002270515 | 9/2002 | |
| JP | 2002-299699 | 10/2002 | |
| JP | 2002289923 | 10/2002 | |
| JP | 2002299699 A | 10/2002 | |
| JP | U3091911 | 11/2002 | |
| JP | 2002353497 | 12/2002 | |
| JP | 2002353516 | 12/2002 | |
| JP | 2002368286 | 12/2002 | |
| JP | 20022368277 | 12/2002 | |
| JP | 2003017756 | 1/2003 | |
| JP | 2003036707 | 2/2003 | |
| JP | 2003037297 | 2/2003 | |
| JP | 2003046117 | 2/2003 | |
| JP | 2003046140 | 2/2003 | |
| JP | 2003046141 | 2/2003 | |
| JP | 2003-124522 | 4/2003 | |
| JP | 2003110146 | 4/2003 | |
| JP | 2003115204 | 4/2003 | |
| JP | 2003124524 | 4/2003 | |
| JP | 2003-515956 | 5/2003 | |
| JP | 2003533030 | 5/2003 | |
| JP | 2003174191 | 6/2003 | |
| JP | 2003209283 | 7/2003 | |
| JP | 2003218383 | 7/2003 | |
| JP | 2003234509 | 8/2003 | |
| JP | 2003234509 A | 8/2003 | |
| JP | 2003258296 | 8/2003 | |
| JP | 2003-529889 | 10/2003 | |
| JP | 2003533030 | 11/2003 | |
| JP | 2003347601 | 12/2003 | |
| JP | 2004-031856 | 1/2004 | |

(56) References Cited

FOREIGN PATENT DOCUMENTS

| | | |
|---|---|---|
| JP | 2004031856 | 1/2004 |
| JP | 2004505434 | 2/2004 |
| JP | 2004-080046 | 3/2004 |
| JP | 2004071357 | 3/2004 |
| JP | 2004-103443 | 4/2004 |
| JP | 2004119839 | 4/2004 |
| JP | 2004511080 | 4/2004 |
| JP | 2004152808 | 5/2004 |
| JP | 2004238441 | 8/2004 |
| JP | 2004266124 | 9/2004 |
| JP | 2005266124 | 9/2004 |
| JP | 2004-356116 | 12/2004 |
| JP | 2004363343 | 12/2004 |
| JP | 2004363537 | 12/2004 |
| JP | 20055433 | 1/2005 |
| JP | 2005026276 | 1/2005 |
| JP | 2005045199 | 2/2005 |
| JP | 2005050838 | 2/2005 |
| JP | 2005077089 | 3/2005 |
| JP | 2005109212 | 4/2005 |
| JP | 2005123238 | 5/2005 |
| JP | 2005-142311 | 6/2005 |
| JP | 2005166937 | 6/2005 |
| JP | 2005166941 | 6/2005 |
| JP | 2005167079 | 6/2005 |
| JP | 2005175389 | 6/2005 |
| JP | 2005-191514 | 7/2005 |
| JP | 2005191414 | 7/2005 |
| JP | 2005191514 | 7/2005 |
| JP | 20055191192 | 7/2005 |
| JP | 2005209852 | 8/2005 |
| JP | 2005-232305 | 9/2005 |
| JP | 2005244152 | 9/2005 |
| JP | 2005294736 A | 10/2005 |
| JP | 2005303012 | 10/2005 |
| JP | 2005303211 | 10/2005 |
| JP | 2005303211 A | 10/2005 |
| JP | 2005340750 | 12/2005 |
| JP | 2005353816 | 12/2005 |
| JP | 2006-049799 | 2/2006 |
| JP | 2006036930 | 2/2006 |
| JP | 2006086254 | 3/2006 |
| JP | 2006114909 | 4/2006 |
| JP | 2006191103 | 7/2006 |
| JP | 2006216717 | 8/2006 |
| JP | 2006229109 | 8/2006 |
| JP | 2006278675 | 10/2006 |
| JP | 2006-313902 | 11/2006 |
| JP | 2006339362 | 12/2006 |
| JP | 2006352061 | 12/2006 |
| JP | 2007005091 | 1/2007 |
| JP | 2007080885 | 3/2007 |
| JP | 2007110053 | 4/2007 |
| JP | 2007-149909 | 6/2007 |
| JP | 2007150331 | 6/2007 |
| JP | 2007180430 | 7/2007 |
| JP | 2007227679 | 9/2007 |
| JP | 2007273763 | 10/2007 |
| JP | 2007300106 | 11/2007 |
| JP | 2007300106 A | 11/2007 |
| JP | 2008514028 A | 5/2008 |
| JP | 2008514030 A | 5/2008 |
| JP | 2008300562 | 12/2008 |
| JP | 2009527913 | 7/2009 |
| JP | 2008514030 A5 | 1/2012 |
| KR | 2002-77135 | 10/2002 |
| KR | 20040087950 | 10/2004 |
| TW | 400438 | 8/2000 |
| TW | 506145 | 10/2002 |
| TW | 511782 | 11/2002 |
| TW | 524391 | 3/2003 |
| TW | 536842 | 6/2003 |
| TW | 546859 | 8/2003 |
| TW | M277882 U | 10/2005 |
| WO | WO 83/00408 A1 | 2/1983 |
| WO | WO 01/41225 A2 | 6/2001 |
| WO | WO 02061847 | 8/2002 |
| WO | WO 03005458 A1 | 1/2003 |
| WO | WO 03010832 | 2/2003 |
| WO | WO 03/065464 A1 | 8/2003 |
| WO | WO 003065464 | 8/2003 |
| WO | WO 03065464 A1 | 8/2003 |
| WO | WO2004/100279 | 11/2004 |
| WO | WO 2005031882 | 4/2005 |
| WO | WO 2005048361 A2 | 5/2005 |
| WO | WO 2005112137 | 11/2005 |
| WO | WO 2005112137 A1 | 11/2005 |
| WO | WO 2005/124877 | 12/2005 |
| WO | WO 2006028312 A1 | 3/2006 |
| WO | WO 2006035664 A | 4/2006 |
| WO | WO 2006036565 | 4/2006 |
| WO | WO 2006036565 A2 | 4/2006 |
| WO | WO 2006036582 | 4/2006 |
| WO | WO 2006036582 A1 | 4/2006 |
| WO | WO 2006/099741 A | 9/2006 |
| WO | WO 2006099741 | 9/2006 |
| WO | WO 2007/063460 A1 | 6/2007 |
| WO | WO 2007/141763 A1 | 12/2007 |
| WO | WO 2009/039805 A1 | 4/2009 |

OTHER PUBLICATIONS

Petition from Japanese Patent Appl. No. 2014-14901, dated Mar. 11, 2015.
Office Action from Japanese Patent Appl. No. 2013-16358, dated Mar. 10, 2015.
Notice of Allowance from Taiwanese Patent Appl. No. 101138314, dated Mar. 18, 2015.
Notice of Allowance from Taiwanese Patent Appl. No. 093112133, dated Feb. 17, 2015.
Office Action from U.S. Appl. No. 10/836,743, dated Jan. 30, 2015.
Office Action from U.S. Appl. No. 11/708,990, dated Feb. 13, 2015.
Office Action from U.S. Appl. No. 11/523,381, dated Mar. 13, 2015.
Office Action from Chinese Appl. No. 201210252142.8, dated Dec. 11, 2014.
Summary of Pretrial Report from Japanese Appl. No. 2011-229090, dated Dec. 19, 2014.
Translated Office Action from Taiwanese Appl. No. 099121883, dated Nov. 13, 2014.
First Office Action and Search Report from Chinese Appl. No. 2011800219066, dated Dec. 26, 2014.
Office Action from U.S. Appl. No. 11/738,665, dated Nov. 28, 2014.
Office Action from U.S. Appl. No. 11/523,381, dated Dec. 8, 2014.
Office Action from U.S. Appl. No. 10/786,755, dated Dec. 31, 2014.
Decision of Rejection from Japanese Patent Appl. No. 2011-150211, dated Oct. 14, 2014.
Decision of Re-Examination from Chinese Appl. No. 200910137491.3, dated Nov. 21, 2014.
Examination Report from European Patent Appl. No. 08 170 514.7-1564, dated Nov. 12, 2014.
Examiner's Reconsideration Report from Japanese Appl. No. 2012-232743, dated Nov. 10, 2014.
Examiner's Reconsideration Report from Japanese Appl. No 2012-232744, dated Nov. 11, 2014.
Notice of Prelim. Pre-Appeal Examination from Japanese Patent Appl. No. 2012-247904, dated Feb. 10, 2015.
Final Notification of Reasons for Rejection from Japanese Patent Appl. No. 2011-248746, dated Jan. 13, 2015.
Third Office Action from Chinese Patent Appl. No. 2011-103799648, dated Jan. 13, 2015.
Pretrial Report from Japanese Patent Appl. No. 2012-288056, dated Jan. 21, 2015.
Official Action from Japanese Patent Appl. No. 2012-232743 dated Apr. 20, 2015.
Official Action from Japanese Patent Appl. No. 2012-232744, dated Apr. 20, 2015.
Trial Decision and Notice of Allowance from Japanese Patent Appl. No. 2013-16358, dated Apr. 14, 2015.
Preliminary Examination Report from Japanese Patent appl. No. 2012-274904, dated Jan. 26, 2015 (received Apr. 27, 2015).

(56) References Cited

OTHER PUBLICATIONS

Office Action from Japanese Appl. No. 2011-229090, dated Jun. 2, 2015.
Fourth Office Action from Chinese Patent Appl. No. 2009101374913, dated Apr. 21, 2015.
Office Action from U.S. Appl. No. 11/738,665, dated May 11, 2015.
Office Action from U.S. Appl. No. 10/836,743, dated May 26, 2015.
Certificate of Patent for Japanese Patent Appl. No. 2006-533962, dated May 22, 2015.
Notice of Issuance from Chinese Patent Appl. No. 201210252142.8, dated Jun. 3. 2015.
Appeal Decision in Japanese Patent Appl. No. 2012-274904, dated Jun. 23, 2015.
Fourth Office Action from Chinese Patent Appl. No. 2011103799648, dated Jul. 14, 2015.
Reasons for Rejection from Japanese Patent Appl. No. 2011-229090, dated Jun. 2, 2015.
Office Action from Japanese Patent Appl. No. 2012-232743, dated Dec. 14, 2015.
U.S. Appl. No. 10/911,643, filed Aug. 5, 2004, Kato, et al.
U.S. Appl. No. 11/029,389, filed Jan. 6, 2005, Imai.
Second Office Action from Chinese Patent appl. No. 201180021906.6, dated Nov. 4, 2015.
Office Action from U.S. Appl. No. 11/523,381, dated Oct. 7, 2015.
Response to OA from U.S. Appl. No. 10/836,743, filed Dec. 2, 2015.
Office Action from U.S. Appl. No. 10/836,743, dated Oct. 8, 2015.
Response to OA from U.S. Appl. No. 10/836,743, filed Dec. 4, 2015.
Examination from European Patent Appl. No. 05 761 972.8-1504, dated Nov. 9, 2015.
Second Office Action from Chinese Patent Appl. No. 2011800219066, dated Nov. 4, 2015.
Fifth Office Action from Chinese Patent Appl. No. 2009101374913, dated Jan. 6, 2016.
Decision of Rejection from Chinese Patent Appl. No. 2011103799648, dated Jan. 21, 2016.
Notice of Allowance from Chinese Patent Appl. No. 201180021906.6, dated Mar. 17, 2016.
Request for Correction from Chinese Patent Appl. No. 2011500219066, dated Feb. 26, 2016.
Notice of Allowance from Japanese Patent Appl. No. 2013-509039, dated Mar. 8, 2016.
Office Action from U.S. Appl. No. 10/836,743; Feb. 8, 2016.
Office Action from U.S. Appl. No. 11/523,381; Feb. 12, 2016.
Office Action from U.S. Appl. No. 14/302,113; Mar. 10, 2016.
Office Action from Japanese Patent Appl. No. 2013-509039, dated Aug. 3, 2015.
PCT International Preliminary Report, PCT/US05/20603, Mar. 2008.
Windisch et al. "Impact of Texture-Enhanced Transmission on High-Efficiency Surface-Textured Light-Emitting Diodes", Applied Physics Letters vol. 79, No. 15, Oct. 2001, pp. 2315-2317.
Schnitzer et al. "30% External Quantum Efficiency From Surface Textured, Thin-Film Light-Emitting Diodes", Applied Physics Letters, Oct. 18, 1993, No. 16, vol. 64, Oct. 1993, pp. 2174-2176.
Windisch et al. "Light-Extraction Mechanisms in High-Efficiency Surface-Textured Light-Emitting Diodes", IEEE Journal on Selected Topics in Quantum Electronics, vol. 8, No. 2, Mar./Apr. 2002, pp. 248-255.
Streubel, et al. "High Brightness AlGaInP Light-Emitting Diodes", IEEE Journal on Selected Topics in Quantum Electronics, vol. 8, No. 2, Mar./Apr. 2002, pp. 321-332.
Windisch et al., *Impact of Texture-Enhanced Transmission on High-Efficiency Surface-Textured Light-Emitting Diodes*, Applied Physics Letters, vol. 79, No. 15, Oct. 8, 2001, pp. 2315-2317.
Schnitzer et al., *30% External Quantum Efficiency From Surface Textured, Thin-Film Light-Emitting Diodes*, Applied Physics Lett. 63(16), Oct. 18, 1993, pp. 2174-2176.

Windisch et al., *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.
Streubel et al., *High Brightness AlGaInP Light-Emitting Diodes*, IEEE Journal on Selected Topics in Quantum Electronics, vol. 8, No. 2, Mar./Apr. 2002, pp. 321-332.
Shor et al., *Direct Observation of Porous SiC Formed by Anodization in HF*, Appl. Phys. Lett. 62 (22), May 31, 1993, pp. 2836-2838.
Windisch et al., *40% Efficient Thin-Film Surface-Textured Light-Emitting Diodes by Optimization of Natural Lithography*, IEEE Transactions on Electron Devices, vol. 47, No. 7, Jul. 7, 2000. pp. 1492-1498.
US 2004/094,774 A1, (Steigerwald, Daniel, et al.), May 20, 2004.
Khan F. A. et al, "High Rate Etching of SIC Using Inductively Coupled Plasma Reactive Ion Etching in SF6-Based Gas Mixtures", Applied Physics Letters, AIP, American Institute of Physics, Melville, NY, US, vol. 75, No. 15, Oct. 11, 1999 pp. 2268-2270.
Palmour J W et al., "Crystallographic Etching Phenomenon During Plasma Etching of SIC (100) Thin Films in SF6", Journal of the Electrochemical Society, Electrochemical Society. Manchester, New Hampshire, U.S., vol. 136, No. 2, Feb. 1, 1989, pp. 491-495.
Kelner G. et al., "Plasma Etching of Beta-SIC", Journal of the Electrochemical Society, Electrochemical Society. Manchester, New Hampshire, U.S. vol. 134, No. 1, Jan. 1987, pp. 253-254.
American Institute PF Physics Handbook, Third Edition, McGraw-Hill, Ed: Dwight E. Gray, 1972.
Lagoubi, et al. "Conditioning of N-Silicon by Photoelectrochemical Etching for Photovoltaic Applications", Proc. of the 11$^{th}$ E.C. Photovoltaic Solar Energy Conference, Oct. 12, 1992-Oct. 16, 1992, pp. 250-253, XP008043956, pp. 252-253 Figure 8.
Patent Abstracts of Japan 07007179, Oct. 1995, Sanyo Electric Co Ltd, "Light Emitting Elements".
Journal of Optics A: Pure and Applied Optics 7 (2005) S3-S11, Review Article "Left-Handed Electromagnetism Obtained Via Nanostructured Metamaterials: Comparison With That From Microstructured Photonic Crystals", Mathias Perrin et al.
Journal of Modern Optics vol. 52, No. 8, May 2005, pp. 1155-1160, "Design and Fabrication of Omnidirectional Reflectors in the Visible Range", Weihua Lin et al.
Windisch et al., *Non-Resonant Cavity Light-Emitting Diodes*, In Light-Emitting Diodes: Research, Manufacturing, and Application 1V, H. Walter Yao et al., Proceesdings of SPIE vol. 3938 (2000), pp. 70-76.
Zangooie et al., *Surface, Pore Morphology, and Optical Properties of Porous 4H-SiC*, Journal of the Electrochemical Society, 148(6) G297-6302 (2001) Jan. 9, 2001.
Mimura et al, *Blue Electroluminescence From Porous Silicon Carbide*, Appl. Phys. Lett 65(26), Dec. 26, 1994, pp. 3350-3352.
Kasugai et al., "Moth-Eye Light-Emitting Diodes", Mater Res. Soc. Symp. Proc. vol. 831, 2005 Materials Research Society, pp. E1.9.1-E1.9.6.
Related Indian Patent Application No. 4867/DELNP/2005, first examination report dated: Apr. 4, 2008.
PCT International Search Report and Written Opinion from related PCT application No. PCT/US2008/010703, date: Aug. 26, 2009.
U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.

(56) References Cited

OTHER PUBLICATIONS

U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 11/895,573, filed Aug. 24, 2007.
U.S. Appl. No. 11/835,044, filed Aug. 7, 2007.
U.S. Appl. No. 12/248,220, filed Oct. 9, 2008.
U.S. Appl. No. 12/277,745, filed Nov. 25, 2008.
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Cree® XLamp® 7090 XR-E Series LED Binning and Labeling.
From related application: European Office Action dated Dec. 12, 2009.
First Office Action from Chinese Patent Application No. 200910137491.3 mailed Apr. 14, 2010.
Official Notice of Rejection for Japanese Patent Application No. 2006-513442 dated Jun. 8, 2010.
International Search Report and Written Opinion for PCT/US2010/024980 mailed Oct. 6, 2010.
Office Action for German Patent Application No. 10 2008 029 318.0 dated mailed Dec. 13, 2010.
Office Action from U.S. Appl. No. 10/836,743, dated: Dec. 8, 2009.
Response to Office Action from U.S. Appl. No. 10/836,743, filed Apr. 8, 2010.
Office Action from U.S. Appl. No. 12/821,069, dated: Dec. 28, 2010.
Response to Office Action from U.S. Appl. No. 12/821,069, filed Apr. 25, 2011.
Office Action from U.S. Appl. No. 11/985,410, dated: Jan. 4, 2010.
Response to Office Action from U.S. Appl. No. 11/985,410, filed May 11, 2010.
Office Action from U.S. Appl. No. 10/836,743, dated: Apr. 29, 2010.
Response to Office Action from U.S. Appl. No. 10/836,743, filed Aug. 30, 2010.
Office Action from U.S. Appl. No. 12/384,277, dated: May 13, 2010.
Response to Office Action from U.S. Appl. No. 12/384,277, filed Sep. 2, 2010.
Office Action from U.S. Appl. No. 11/708,990, dated: May 26, 2010.
Response to Office Action from U.S. Appl. No. 11/708,990, filed Nov. 18, 2010.
Office Action from U.S. Appl. No. 11/985,410, dated: Jul. 15, 2010.
Response to Office Action from U.S. Appl. No. 11/985,410, filed Dec. 14, 2010.
Office Action from U.S. Appl. No. 12/845,629, dated: Sep. 29, 2010.
Response to Office Action from U.S. Appl. No. 12/845,629, filed Jan. 26, 2011.
Office Action from U.S. Appl. No. 10/836,743, dated: Feb. 14, 2011.
Response to Office Action from U.S. Appl. No. 10/836,743, filed Apr. 27, 2011.
Office Action from U.S. Appl. No. 11/708,990, dated: Feb. 16, 2011.
Office Action from U.S. Appl. No. 11/523,381, dated: Sep. 30, 2010.
Response to Office Action from U.S. Appl. No. 11/523,381, filed Nov. 24, 2010.
Office Action from U.S. Appl. No. 11/523,381, dated: Mar. 21, 2011.
Response to Office Action from U.S. Appl. No. 11/523,381, filed Jun. 20, 2011.
Office Action from U.S. Appl. No. 10/836,743, dated: Jun. 15, 2011.
Office Action from U.S. Appl. No. 12/384,277, dated: Apr. 28, 2011.
Notice of Allowance from U.S. Appl. No. 12/821,069, dated: Jun. 15, 2011.
Office Action from U.S. Appl. No. 12/845,629, dated: Apr. 6, 2011.
Extended European Search Report for European Patent Application No. 10185708.4 mailed Dec. 2, 2010.
Office Action for Korean Patent Application No. 10-2005-7020463 mailed Dec. 21, 2010.
Notice of Reasons for Rejection from Japanese Patent Application No. 2008-037765 dated Mar. 23, 2011.
Summary of Notice of Reasons for Rejection for Japanese Patent Application No. 2007-520314 mailed May 10, 2011.
Office Action for Japanese Patent Application No. JP 2008-163311 issued Mar. 29, 2011.
Office Action for Japanese Patent Applidation No. JP 2006-513442 mailed May 12, 2011.
International Search Report and Written Opinion for PCT Application No. PCT/US2011/000381 mailed Jun. 8, 2011.
Notification of Reason(s) for Rejection for counterpart Japanese Patent Application No. 2008-309821 dated Sep. 12, 2011.
Notification of the Second Office Action for CN 200910137491.3 mailed Dec. 23, 2011.
Extended Search Report for European Patent Application No. EP 08170514.7 dated Aug. 8, 2011.
Office of the IPO for Taiwan Patent Application No. TW 093112133 issued Jun. 23, 2011.
Office Action from U.S. Appl. No. 12/384,277, dated: Oct. 11, 2011.
Office Action from U.S. Appl. No. 11/708,990, dated: Nov. 15, 2011.
Office Action from U.S. Appl. No. 11/523,381, dated: Dec. 2, 2011.
Notice of Reasons for Rejection for Japanese Patent Application No. 2006-533962, dated May 22, 2012.
Joseph S. Shor. et al., "Direct observation of porous SiC formed by anodization in HF", Appl. Phys. Lett. 62 (22), May 31, 1993.
Summary of Final Notice of Reasons for Rejection from Japanese Patent Application No. 2007-520314, dated May 8, 2012.
Examination Report from European Application No. 04 788 908.4-1224, dated Jun. 8, 2012.
Office Action from Taiwanese Patent Application No. 093112133, dated Jul. 27, 2012.
Interrogation from Japanese Patent Application No 2009-507696, dated Aug. 21, 2012.
Decision of Rejection from Japanese Patent Application No. 2008-037765 dated Sep. 4, 2012.
Decision of Rejection from Japanese Patent Application No. 2006-513442, dated Aug. 23, 2012.
Search Report for Chinese Application No. 200910137491.3, dated Sep. 14, 2012.
Third Office Action for Chinese Application No. 200910137491.3, dated Sep. 24, 2012.
Inquiry from an Appeal Board from Japanese Patent Appl. No. 2006-513442, dated Mar. 13, 2013.
Official Action from European Patent Appl. No. 05 761 972.8-1508, dated Mar. 5, 2013.
Decision of Rejection from Japanese Patent Application No. 2007-520314, dated Apr. 23, 2013.
Decision of Dismissal of Amendment from Japanese Patent Application No. 2007-520314, dated Apr. 23, 2013.
Decision of Rejection from Japanese Patent Application No. 2006-533962 dated Apr. 23, 2013.
Kasugai, et al. "Moth-Eye Light Emitting Diodes", Mater. Res. Soc. Symp. Proc. vol. 831 © 2005 Materials Research Society.
Decision of Rejection from Chinese Patent Appl. No. 2009-10137491.3, dated Apr. 15, 2013.
Office Action from Korean Patent Appl. No. 10-2008-7017800, dated Mar. 5, 2013.
Office Action from Japanese Patent Appl. No. 2008-547566, dated Nov. 28, 2012 (Brown).
Office Action from U.S. Appl. No. 13/660,131, dated May 30, 2013.
Office Action from U.S. Appl. No. 13/347,243, dated Aug. 15, 2012.
Office Action from U.S. Appl. No. 12/635,818, dated Mar. 14, 2011.
Response to OA from U.S. Appl. No. 13/347,243, filed Sep. 27, 2012.
Response to OA from U.S. Appl. No. 12/635.818, filed Jun. 16, 2011.
Office Action from U.S. Appl. No. 12/635,818, dated Jul. 15, 2011.

(56) References Cited

OTHER PUBLICATIONS

Office Action from U.S. Appl. No. 12/635,818, dated Nov. 17, 2011.
Response to OA from U.S. Appl. No. 12/635,818, filed Sep. 26, 2011.
Response to OA from U.S. Appl, No, 12/635,818, filed Feb. 16, 2012.
Office Action from U.S. Appl. No. 13/347,243, dated Apr. 25, 2012.
Office Action from U.S. Appl. No. 12/384,277, dated Jun. 27, 2012.
Office Action from U.S. Appl. No. 10/836,743, dated Jul. 11, 2012.
Office Action from U.S. Appl. No. 11/523,381, dated Oct. 3, 2012.
Office Action from U.S. Appl. No. 12/384,277, dated Nov. 27, 2012.
Office Action from U.S. Appl. No. 12/845,629, dated Feb. 26, 2013.
Office Action from U.S. Appl. No. 10/836,743, dated Feb. 25, 2013.
Response to OA from U.S. Appl. No. 13/347,243, dated Jul. 20, 2012.
Response to OA from U.S. Appl. No. 12/384,277, dated Sep. 27, 2012.
Response to OA from U.S. Appl. No. 10/836,743, dated Sep. 11, 2012.
Response to OA from U.S. Appl. No. 11/523,381, dated Dec. 21, 2012.
Response to OA from U.S. Appl. No. 12/384,277, dated Jan. 28, 2013.
Response to OA from U.S. Appl. No. 12/845,629, dated Apr. 18, 2013.
Response to OA from U.S. Appl No. 10/836,743, dated May 17, 2013.
Office Action from U.S. Appl. No. 12/384,277, dated Mar. 26, 2013.
Response to OA from U.S. Appl. No, 12/384,277, filed Jun. 26, 2013.
Office Action from U.S. Appl. No. 11/523,381, dated Apr. 5, 2013.
Response to OA from U.S. Appl. No. 11/523,381, filed Jun. 5, 2013.
Office Action from U.S. Appl. No. 13/096,982, dated Dec. 12, 2012.
Response to OA from U.S. Appl. No. 13/046,982, filed Mar. 1, 2013.
Office Action from U.S. Appl. No. 13/046,982, filed Aug. 1, 2012.
Response to OA from U.S. Appl. No. 13/046,982, filed Sep. 21, 2012.
Office Action from U.S. Appl. No. 13/046,982, filed Dec. 7, 2011.
Response to OA from U.S. Appl. No. 13/046,982, filed Jun. 6, 2012.
Office Action from U.S. Appl. No. 13/096,982, filed Jul. 19, 2011.
Response to OA from U.S. Appl. No. 13/046,982, filed Oct. 17, 2011.
Office Action from U.S. Appl. No. 12/845,629, dated Jun. 12, 2013.
Decision of Final Rejection from Japanese Patent Application No. 2008-309821, dated Jun. 14. 2012.
First Office Action from Chinese Patent Application No. 200810186835.5 dated Jul. 3, 2012.
Second Office Action from Chinese Patent Application No. 200810186835.5, dated Feb. 25, 2013.
Notice of Reasons for Rejection from Japanese Patent Application No. 2009-507696, dated Feb. 5, 2013.
Interrogation from Japanese Patent Application No. 2008-37765. dated Mar. 19, 2013.
Notification of Reasons for Rejection from Japanese Patent Application No. 2011-248746, dated Jan. 31, 2013.
Office Action from Japanese Patent Application No. 2011-229090, dated Apr. 16, 2013.
Notice of Reasons for Rejection from Japanese Patent Application No. 2006-533962, dated Dec. 26, 2011.
Notification of Second Office Action from Chinese Patent Application No. 200780014958.4, dated Dec. 21, 2011.
Decision of Rejection from Japanese Patent Application No. 2009-507696, dated Dec. 26, 2011.
Communication pursuant to Article 94(3) EPC from Patent Application No. 04 788 908.4-1224, dated Jan. 27, 2012.
Response to Office Action from U.S. Appl. No. 12/384,277, filed Feb. 28, 2012.
Response to Office Action from U.S. Appl. No. 11/708,990, filed Feb. 15, 2012.
Response to Office Action from U.S. Appl. No. 11/523,381, filed Mar. 27, 2012.
Office Action from U.S. Appl. No. 10/836,743, dated: Jan. 26, 2012.
Office Action from U.S. Appl. No. 12/771,938, dated: Feb. 1, 2012.
Decision of Final Rejection from Japanese Patent Appl. No. 2011-248746, dated Jun. 12, 2013.
Official Action from European Patent Appl. No. 057619728, dated Mar. 8, 2013.
Office Action and Search Report from Taiwanese Patent Appl. No. 094121086, dated May 15, 2013.
Streubel, et al., "High Brightness AlGaInP Light-Emitting Diodes", IEEE Journal of Selected Topics in Quantum Electronics, vol. 8, No. 2, pp. 324-325, Mar./Apr. 2002.
Decision of Rejection from Japanese Patent appl. No. 2010-254633, dated Jun. 4, 2013.
Office Action from Japanese Patent appl. No. 2012-232743, dated Jun. 25, 2013.
Third Office Action from Chinese Patent Appl. No. 200810186835.5, dated Aug. 22, 2013.
Reasons for Rejection from Japanese Patent Appl. No. 2012-232744, dated Jun. 26, 2013.
Reasons for Rejection from Japanese Patent Appl. No. 2011-150211, dated Aug. 26, 2013.
Reasons for Rejection from Japanese Patent Appl. No. 2011-229090, dated Aug. 27, 2013.
Reasons for Rejection from Japanese Patent Appl. No. 2009-507696, dated Aug. 20, 2013.
Office Action from U.S. Appl. No. 11/708,990, dated Jul. 11, 2013.
Office Action from U.S. Appl. No. 10/786,755, dated Jun. 12, 2013.
Response to OA from U.S. Appl. No. 10/786,755, filed Sep. 10, 2013.
Office Action from U.S. Appl. No. 10/836,743, dated Aug. 22, 2013.
Office Action from U.S. Appl. No. 11/523,381, dated Sep. 17, 2013.
Reasons for Rejection from Japanese Patent Appl. No. 2006-513442, dated Sep. 9, 2013.
Notification of Reasons for Rejection from Japanese Patent Appl. No. 2008-309821, dated Sep. 19, 2013.
Office Action from U.S. Appl. No. 11/738,665, dated Nov. 8, 2013.
Office Action from U.S. Appl. No. 12/845,629, dated Sep. 24, 2013.
Office Action from Japanese Patent Appl. No. 2012-232743, dated Nov. 20, 2013.
Office Action from Japanese Patent Appl. No. 2012-232744, dated Nov. 20, 2013.
Examination Report from European Patent Appl. No. 04788908.4-1901. dated Jan. 9, 2014.
Interrogation from Japanese Patent Appl. No. 2006-533962, dated Dec. 10, 2013.
First Office Action from Chinese Patent Appl. No. 201110379964.8, dated Nov. 22, 2013.
Notice of Reasons for Rejection from Japanese Patent Appl. No. 2012-288056, dated Dec. 10, 2013.
Reasons for Rejection from Japanese Patent Appl. No. 2010-254633, dated Dec. 24, 2013.
Reasons for Rejection from Japanese Patent Appl. No. 2012-274904, dated Jan. 7, 2014.
Re-Examination from Taiwanese Patent Appl. No. 100145116, dated Dec. 19, 2013.
Office Action from Japanese Patent Appl. No. 2007-520314, dated Nov. 12, 2013.
Office Action from Taiwanese Patent Appl. No. 094121086, dated Dec. 10, 2013.
Reasons of Rejection from Japanese Patent appl. No. 2012-20751. dated Feb. 13, 2014.
Final Notification of Reasons for Rejection from Japanese Patent Appl. No. 2006-513442, dated Feb. 13, 2014.
Examination from European Patent Appl. No. 07754938.4-1564, dated Mar. 18, 2014.
Reasons of Rejection from Japanese Patent appl. No. 2011-229090, dated Mar. 3, 2014.
Office Action from U.S. Appl. No. 10/836,743, dated Nov. 19, 2013.
Office Action from U.S. Appl. No. 12/845,629, dated Feb. 11, 2014.
Office Action from U.S. Appl. No. 11/708,990, dated Feb. 12, 2014.

(56) References Cited

OTHER PUBLICATIONS

Fourth Office Action from Chinese Patent Appl No. 2008-10186835.5, dated Mar. 5, 2014.
Interrogation from Japanese Patent Appl No. 2009-507696, dated: Mar. 11, 2014.
Notice of Reasons for Rejection from Japanese Patent Appl. No. 2013-509039, dated Mar. 11, 2014.
Decision to Refuse a European Patent Application from European Patent Appl. No. 10 181 251.9-1555, dated Apr. 22, 2014.
Reasons of Rejection from Japanese Patent Appl. No. 2006-533962, dated Jun. 3, 2014.
Decision of Dismissal of Appeal against Final Rejection from Korean Patent Appl. No. 10-2011-7028750, dated Jun. 11, 2014.
Decision of Patent Grant from Japanese Patent Appl. No 2007-520314, dated Jun. 3, 2014.
Reasons for Rejection from Japanese Patent Appl. No. 2011-150211, dated May 14, 2014.
Decision of Rejection from Japanese Patent Appl. No. 2012-288056, dated Jun. 3, 2014.
Summary of the Appeal Decision from Japanese Patent Appl. No. 2008-309821, dated Jun. 28, 2014.
Intention to Grant from European Patent Application No. 04788908.4-191, dated Jul. 14, 2014.
Office Action from Chinese Patent Appl. No. 201210252142.8, dated May 23, 2014.
Decision of Rejection from Japanese Patent Appl. No. 2012-274904, dated Jul. 1, 2014.
Office Action from U.S. Appl. No. 10/836,743, dated May 28, 2014.
Response to OA from U.S. Appl. No. 10/836,743, filed Jul. 28, 2014.
Office Action from U.S. Appl. No. 11/523,381, dated Jul. 2, 2014.
Notification to Grant from Chinese Patent Appl. No. 200810186835.5, dated Aug. 25, 2014.
Office Action and Search Report from Taiwanese Appl. No. 101138314, dated Aug. 5, 2014.
Office Action from Taiwanese Appl. No. 093112133, dated Jul. 25, 2014.
Office Action from U.S. Appl. No. 10/786,755, dated Aug. 7, 2014.
Office Action from U.S. Appl. No. 10/836,743, dated Sep. 2, 2014.
Translation from Japanese to English of Kaizu, M. (JP-(H)04-(0)28269), "Mounting Structure for an LED Bare Chip", published Jan. 30, 1992: prepared by the Translations Branch at the U.S. Patent and Trademark Office.
Minutes from European Patent Office No. 10 181 251.9 dated Apr. 22, 2014.
Office Action from Taiwanese Patent Appl. No. 103202911 dated Apr. 1, 2014.
Office Action from Korean Application 10-2006-7017800, dated Feb. 27, 2014 (Myers).
Office Action from U.S. Appl. No. 11/523,381, dated Apr. 11, 2014.
Office Action from U.S. Appl. No. 11/738,665, dated May 1, 2014.
Official Action from Japanese Patent Appl. No. 2011-248746, dated Aug. 4, 2014.
Decision of Dismissal of Amendment from Japanese Patent Appl. No. 2011-229090, dated Jul. 29, 2014.
Second Office Action from Chinese Patent Appl. No 2011103799648, dated Jul. 11, 2014.
Notice of Allowance for Application No. 20110-22090; Dated Apr. 18, 2016.
Appeal Decision for Api5lication No. 2014-10492; Dated May 8, 2016.

\* cited by examiner

FIG. 6
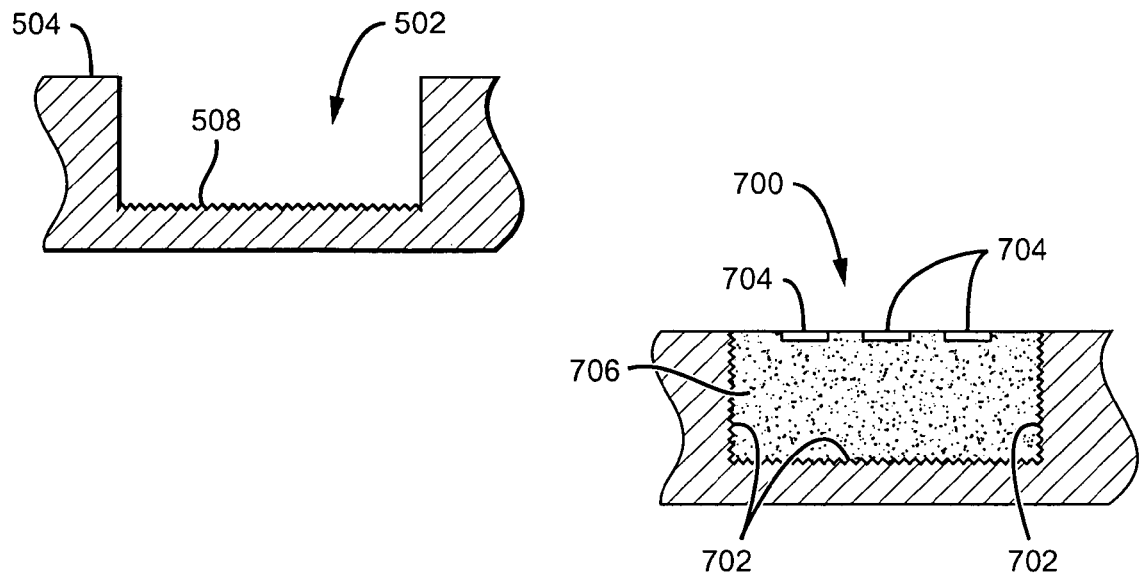
FIG. 7
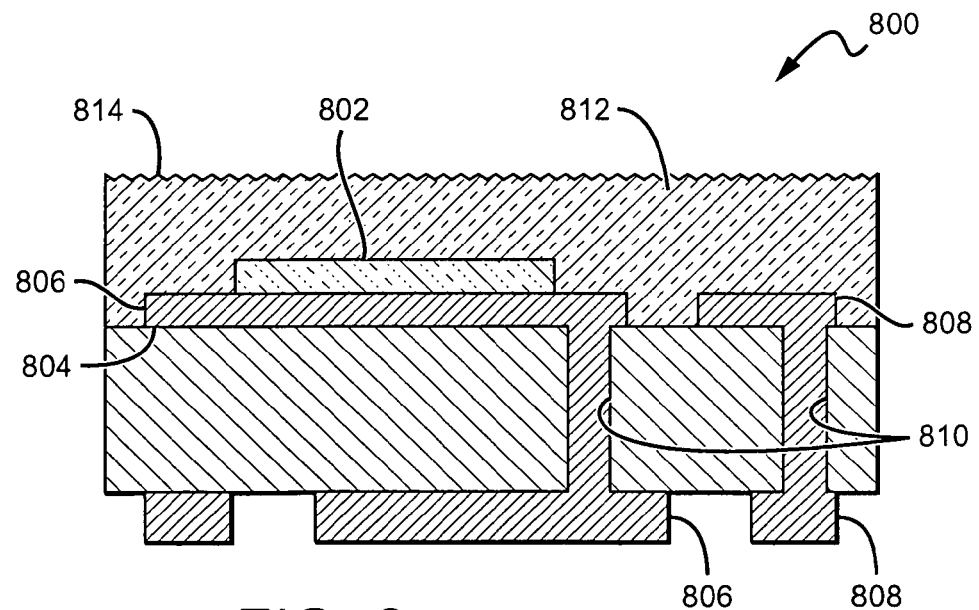
FIG. 8

TEXTURED ENCAPSULANT SURFACE IN LED PACKAGES

BACKGROUND OF THE INVENTION

1. Field of the Invention

The invention relates generally to LED packages and, more particularly, to textured encapsulant surfaces within the LED packages.

2. Description of the Related Art

Light emitting diodes (LED or LEDs) are solid state devices that convert electric energy to light, and generally comprise one or more active layers of semiconductor material sandwiched between oppositely doped layers. Typically, wire bonds are used to apply a bias across the doped layers, injecting holes and electrons into the active layer where they recombine to generate light. Light is emitted from the active layer and from all surfaces of the LED. A typical high efficiency LED comprises an LED chip mounted to an LED package and encapsulated by a transparent medium. The efficient extraction of light from LEDs is a major concern in the fabrication of high efficiency LEDs.

LEDs can be fabricated to emit light in various colors. However, conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the energy of some of the LED's blue light which increases the wavelength of the light, changing its color to yellow. Some of the blue light passes through the phosphor without being changed while a portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

LED packages typically have some type of encapsulant surrounding the LED chip to enhance light extraction from the chip and protect the chip and related contacts structure (e.g., wire bonds) from exposure to physical damage or environmental conditions which could lead to corrosion or degradation. Along with this encapsulant, an optical element such as a simple hemispherical lens is also desired to enhance light extraction from the package and possibly to provide some form of output light beam shaping (control over the angle-dependent emission properties of the lamp). For surface mount packages, which typically require high temperature (200-300° C.) solder reflow processing to attach the LED package to its final fixture, the possible materials typically include silicones and glasses. Silicone lenses are typically molded using injection molding processes, which can place limitations on the properties of the silicone that may be used. Glass lenses are typically formed using a melting process that can limit the possible geometries and add substantial piece part cost to the final lamp. Typical wire bonded LEDs cannot be encapsulated in molten glass because of the high melting temperature of glass.

A common type of LED packaging where a phosphor is introduced over an LED is known as a "glob-in-a-cup" method. An LED chip resides at the bottom of a cup-like recession, and a phosphor containing material (e.g. phosphor particles distributed in an encapsulant such as silicone or epoxy) is injected into and fills the cup, surrounding and encapsulating the LED. The encapsulant material is then cured to harden it around the LED. This packaging, however, can result in an LED package having significant variation of the color temperature of emitted light at different viewing angles with respect to the package. This color variation can be caused by a number of factors, including the different path lengths that light can travel through the conversion material. This problem can be made worse in packages where the phosphor containing matrix material extends above the "rim" of the cup in which the LED resides, resulting in a predominance of converted light emitted sideways into high viewing angles (e.g., at 90 degrees from the optic axis). The result is that the white light emitted by the LED package becomes non-uniform and can have bands or patches of light having different colors or intensities.

The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the large difference in the refractive index between the LED's semiconductor and surrounding ambient. Some LEDs have relatively low light extraction efficiencies because the high index of refraction of the substrate compared to the index of refraction for the surrounding material, such as epoxy. This difference results in a small escape cone from which light rays from the active area can transmit from the substrate into the epoxy and ultimately escape from the LED package.

Different approaches have been developed to reduce TIR and improve overall light extraction, with one of the more popular being surface texturing. Surface texturing increases the light escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002].

U.S. Pat. No. 6,657,236, also assigned to Cree Inc., discloses structures formed on the semiconductor layers for enhancing light extraction in LEDs through the use of internal and external optical elements formed in an array. The optical elements have many different shapes, such as hemispheres and pyramids, and may be located on the surface of, or within, various layers of the LED. The elements provide surfaces from which light refracts or scatters.

In order to emit light having a specific spectral content, it is known to use LED packages having multiple chips. Often, multiple chips having different colors are used in the same package. For example, a red chip, a green chip and a blue chip can be used in combination to form a white light package (solid state RGB). Other multi-chip combinations are also common, such as the solid state RGGB which comprises one red chip, one blue chip and two green chips per unit. Phosphor conversion layers may be used in conjunction with these multi-chip devices, for example, the phosphor converted RGB which is used for high Color Rendering Index applications. Another known device consists of a phosphor converted white LED and a solid state red chip. Other combinations of phosphor-converted colored chips and solid state chips are also known in a multi-chip LED package.

SUMMARY OF THE INVENTION

One embodiment of a light emitting diode (LED) device comprises the following elements. At least one LED chip is disposed on a mount surface. An encapsulant is disposed proximate to the mount surface such that substantially all of the light emitted from the at least one LED passes through the encapsulant. The encapsulant comprises a textured emission surface that is substantially conformal with the mount surface. The encapsulant reduces the total internal reflection of the emitted light as compared to a similar encapsulant having a non-textured emission surface.

One embodiment of a chip-scale package light emitting diode (LED) device comprises the following elements. A plurality of LEDs is disposed on a mount surface. An encapsulant has an emission surface that is substantially parallel to the mount surface. The emission surface is textured to create a plurality of roughening surface features.

One method of fabricating a light emitting diode (LED) device comprises the following actions. A mount surface is provided. At least one LED chip is disposed on the mount surface. An encapsulant having an emission surface is deposited on the at least one LED chip. The encapsulant is shaped such that the emission surface is textured. The encapsulant is cured.

BRIEF DESCRIPTION OF THE DRAWINGS

FIG. 6 shows a cross-sectional view of an embodiment of a cavity in a portion of a mold device.

FIG. 7 shows a cross-sectional view of an embodiment of a cavity in a portion of a mold device.

FIG. 8 shows a cross-sectional view of an embodiment of an LED package device 800.

DETAILED DESCRIPTION OF THE INVENTION

Figure 1:
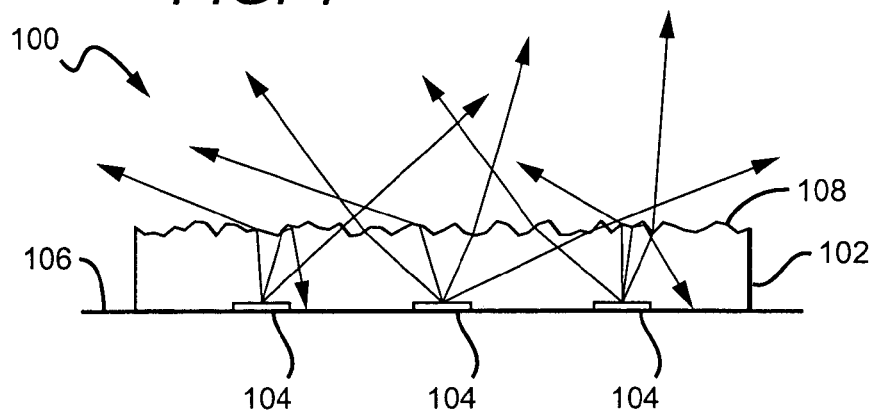
FIG. 1 shows a cross-sectional view of an embodiment of an LED device.

The present invention provides embodiments of an LED device comprising an encapsulant with a textured surface that helps to reduce light loss due to total internal reflection (TIR) while maintaining acceptable color temperature uniformity and color mixing in the output profile. TIR is an optical phenomenon that occurs when a ray of light strikes a medium boundary at an angle that exceeds the critical angle as defined by Snell's Law. The critical angle is a function of the index of refraction differential between the two media. TIR can only occur when light passes from a medium with a higher index of refraction to a medium with a lower index of refraction. If a light ray strikes the medium boundary at an angle greater than the critical angle, the light will reflect back into the medium from which it came rather than escaping as emitted light. The internally reflected light may then be absorbed by materials within the medium or by the medium itself. TIR reduces the extraction efficiency of an LED device.

Encapsulants can formed into many shapes to achieve various design goals. Some LED packages include a dome-shaped encapsulant disposed over the chip to reduce the TIR of the emitted light. The dome-shaped encapsulant may be designed so that the light rays are incident on the inner surface of the encapsulant at close to right angles at all points of incidence. The geometry of these encapsulants ensures that light almost always strikes the boundary at close to a right angle; thus, the light is rarely reflected back into the encapsulant, yielding higher extraction efficiencies.

However, it is not always desirable to use a dome-shaped encapsulant. For example, in multi-chip arrangements it may not be acceptable to assume that the light is emanating from a point at the center of the mount surface on which the chips are disposed. The chips may be mounted in various positions on the mount surface. In many cases, the chips emit light of different colors. Because of the chip placement on the mount surface, each of the colored beams will have different angular distributions, and the emission spectrum will suffer from poor color uniformity in the output profile. Thus, a dome-shaped encapsulant reduces the effects of TIR but can lead to poor color mixing in multi-chip configurations.

A flat encapsulant, on the other hand, will provide a relatively uniform color distribution in the far field. However, the flat encapsulant will suffer from significant TIR, reducing the extraction efficiency of the device. This is especially true for interfaces having a refractive index differential of greater than 0.4, such as epoxy/air, silicone/air or any transparent plastic/air interface, for example. Embodiments of the present invention comprise an encapsulant having a modified surface to reduce the effects of TIR while maintaining relatively uniform color distribution.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogenous layer of material. A single "layer" may contain various scattering material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein but are to include deviations in shapes that result, for example, from manufacturing. A region illustrated or described as rectangular, for example, will typically have rounded or curved features due to normal manufacturing tolerances. Thus, the regions illustrated in the figures are schematic in nature and their shapes are not intended to illustrate the precise shape of a region or particle and are not intended to limit the scope of the invention.

FIG. 1 shows a cross-sectional view of an LED device 100 according to an embodiment of the present invention. The device 100 comprises an encapsulant element 102 that is disposed above the light sources 104 such that substantially all of the light emitted from the sources 104 has to pass through it.

The encapsulant 102 may be very thin such that it barely covers the bond wires, if they are used, or it can be much thicker. An acceptable range for the thickness of the encapsulant is 70-200 micrometers. The ray paths of the emitted light are shown by the arrows in the figures. In this embodiment, the encapsulant 102 is disposed such that the encapsulant 102 and the light sources 104 are mounted to a common surface 106, such as a substrate, for example.

The encapsulant 102 may comprise any structure that is disposed above the sources 104 as described above, and in one embodiment the encapsulant comprises a lens used alone or in combination with other bonding materials to mount the lens over the source. The encapsulant can be transparent, translucent, or luminescent, for example, and can be loaded with wavelength conversion materials, such as phosphors. The encapsulant 102 can be made of silicone, epoxy, glass, plastic or other materials and may perform functions such as beam shaping, collimating, and focusing, etc. The encapsulant 102 may be formed in place over the source as with a mold, or it may be fabricated separately and then subsequently attached to the light source by an adhesive epoxy, for example.

One way to redirect light is to modify selected areas of the encapsulant surface 108. The surface 108 can be modified by several known additive and subtractive methods such as etching or grinding, for example, as discussed in detail below. A textured surface can be produced by any known mass-production method such as molding or casting where the mold surface impresses the texturing contours directly on the encapsulant during the process. Light approaching a modified portion of the encapsulant surface 108 (as opposed to an unmodified portion) has a higher probability of being redirected and exiting the encapsulant 102 at another point. If the light does not exit on the first pass, it may be reflected within the encapsulant 102 and come in contact with the surface 108 again and be emitted on a second pass. The modified surface 108 also has the effect of randomizing the emission angle of the emitted light. As shown in FIG. 1, the irregular features of the modified surface 108 redirect the light, causing it to deviate from the path it originally took from the source 104. Because the light is disassociated from its original path, the output profile exhibits a more uniform color distribution.

The modified surface can be formed by additive or subtractive processes and may have features with many different shapes. For example, material may be added to the encapsulant surface to create irregular structures that will scatter the light. The added material may be deposited by many known processes such as chemical vapor deposition. A textured surface can also be fashioned using a post-additive process such as chemical etching, machining by single or multiple-point tools, sand-blasting, etc. Another method for modifying the surface is to remove portions of the encapsulant material leaving behind small holes and trenches. Many different known subtractive methods are available such as etching, for example. The modified surface can have patterned or random features. In the former case, it may be created by machining to give the surface a specifically patterned texture. If the surface is machined, an acceptable range of the average peak-to-valley size of the surface features would be from 50-200 micrometers. If the surface features are random, they may be formed by several processes including electro-discharge machining. Surface modifications may result in surface features that have several shapes including, spheres or hemispheres, triangles, skewed triangles, pyramids, truncated pyramids and many other shapes. There are many other known methods of modifying an encapsulant surface.

Figure 2:
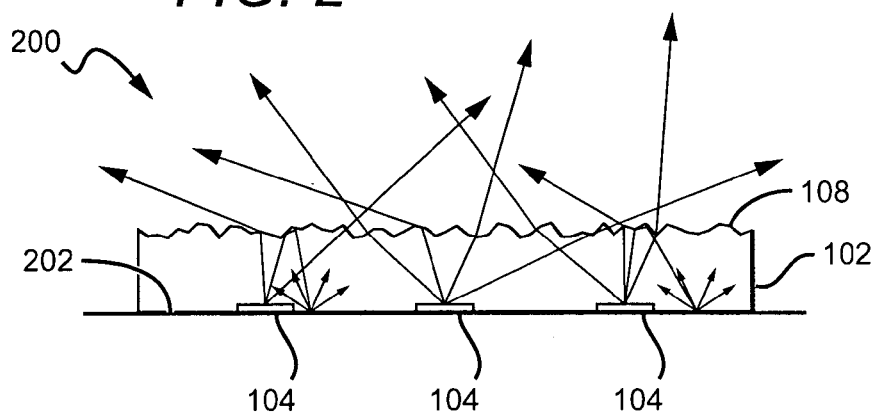
FIG. 2 shows a cross-sectional view of an embodiment of an LED device.

FIG. 2 is a cross-sectional illustration of an LED device 200 according to an embodiment of the present invention. The device 200 functions similarly as the device 100 and shares several common elements. The device 200 comprises a reflective surface 202. As discussed above the modified surface 108 also helps reduce TIR on light interacting with the surface 108 on second, third, etc., passes. The reflective surface 202 can comprise a diffuse reflector, a specular reflector, or a combination of the two. The reflective surface 202 should be highly reflective in the wavelength ranges emitted by the sources 104 for high efficiency. The reflective surface 202 can be specular or textured and can have scattering properties.

Figure 3:
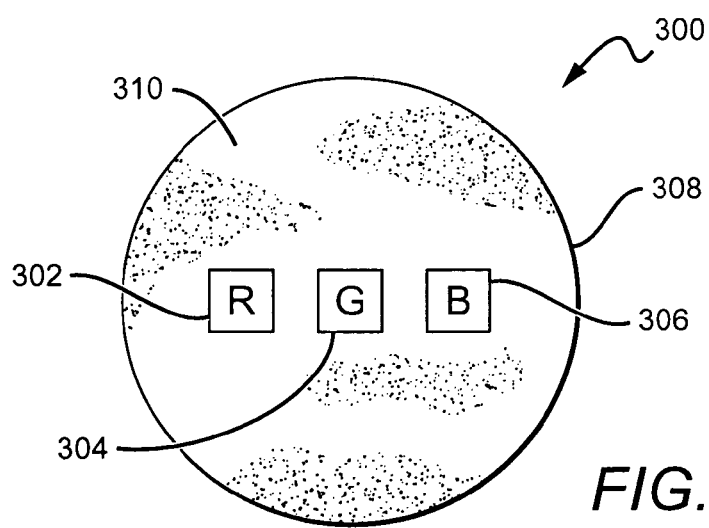
FIG. 3 shows a top plan view of an LED device having red, green and blue LED chips.

FIG. 3 is a top view of an LED device 300. The LED device 300 comprises a red chip 302, a green chip 304, and a blue chip 306, all of which are disposed on a mount surface. This embodiment shows one possible arrangement of chips in an RGB configuration. RGB chips may be arranged in many ways and are not restricted to any particular pattern. Because the chips 302, 304, 306 are not centered on the mount surface, the various colors of light are not emitted into the encapsulant 308 uniformly. For example, if the encapsulant 308 is flat (as shown), the light emitted from the red chip 302 will be incident on the portion of the encapsulant 308 directly above the red chip 302 at angles close to 90°. Whereas light emitted from the blue chip 306 will be incident on that same portion of the encapsulant 308 at much lower angles. Thus, if a randomization element is not used, more red light will be emitted in the space directly above the red chip 302 than blue light, leading to a poor color temperature uniformity in the output profile.

The LED device 300 comprises an encapsulant 308 having a textured surface 310. The encapsulant 308 is disposed such that the light emitted from the chips 302, 304, 306 passes through the encapsulant 308 and into the ambient space. The textured surface 310 improves extraction efficiency by reducing TIR and improves color temperature uniformity by randomizing the emission angle of light rays emitted from the various chips 302, 304, 306. Although this particular embodiment features an RGB chip configuration on a circular mount surface, it is understood that many different colored LED combinations may be used on many different shapes of mount surfaces.

Figure 4:
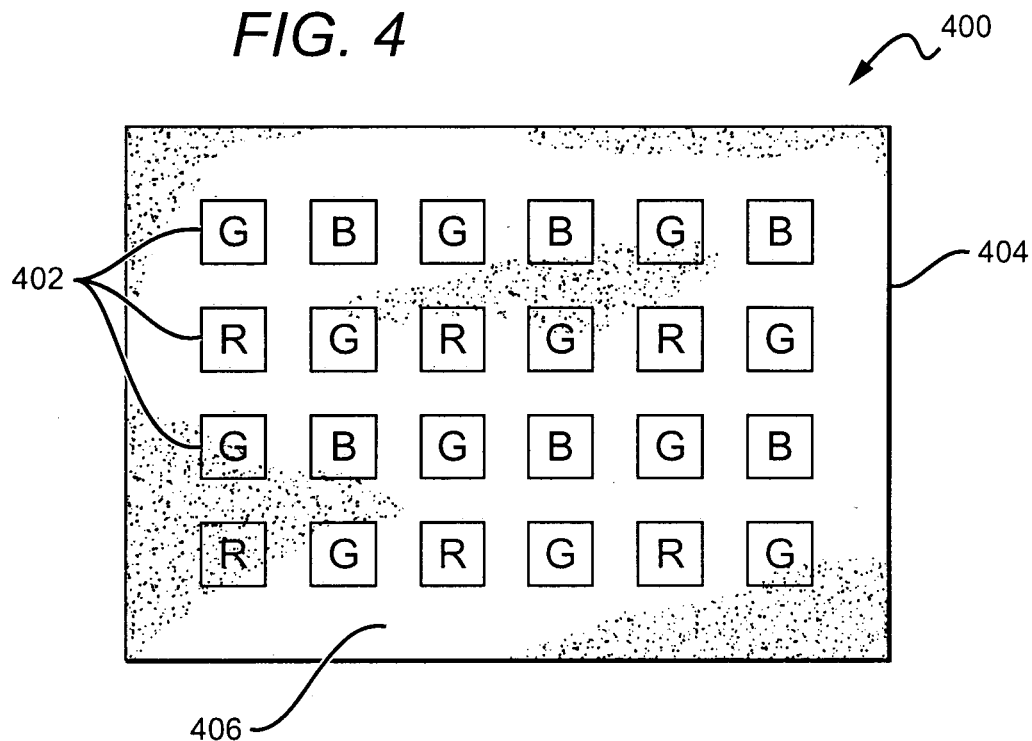
FIG. 4 shows a top plan view of an LED device having several reg, green and blue LED chips.

FIG. 4 is a top plan view of another LED device 400. The device 400 includes several colored LED chips 402 disposed on a rectangular mount surface. This particular embodiment features an RGGB arrangement of red, green and blue emitters. As discussed above many different color and spatial arrangements may be used to achieve a particular output profile. An encapsulant 404 is disposed over the chips 402 so that most of the light emitted passes through the encapsulant 404 into the ambient space. The encapsulant 404 comprises a textured surface 406 that randomizes the emission angle of light rays emitted from the various chips 402, improving the color temperature uniformity of the device 400. The textured surface 406 also reduces TIR. As shown, many chips can be mounted and covered with single encapsulant layer. This particular embodiment features 24 chips. More or fewer chips may be used according to design needs. The encapsulant can be formed or deposited on the mount surface and the chips 402 using a mold, for example.

Figure 5:
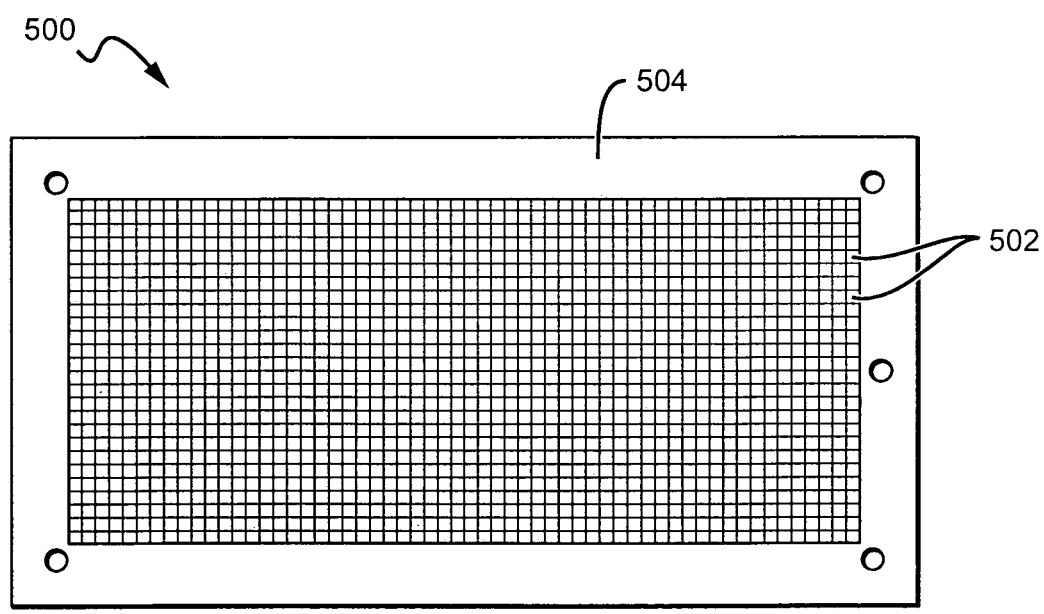
FIG. 5 shows a top plan view of an embodiment of a mold device for simultaneously molding several encapsulants on LED devices.

FIG. 5 shows a top plan view of a mold device 500 used to shape several encapsulants simultaneously for inclusion in a chip-scale package LED. The mold device 500 comprises several cavities 502 arranged in an array on a mold base 504. The width of the cavities may be only slightly larger than the width of a single chip, or the cavities 504 may be wider to accommodate multi-chip arrays and other elements that will be covered by the encapsulant. A plurality of bore holes 506 can be used to mount the mold base 504 to a surface to steady the device during processing. Several LED devices (not shown) can be positioned so that each device is located within or adjacent to the space created by each cavity 502. For example, if the mold device is positioned over the LED devices, each of the devices should be located beneath one of the cavities 502. An encapsulant material can be injected into each of the cavities 502 prior to placing the mold device 500 over the LEDs for processing, or alternatively, the encapsulant material can be injected after the devices are in position as through fill hole (not shown). The encapsulant material may be cured at high temperatures using thermoset plastics, such as epoxies, silicones or hybrids of both.

Each of the cavities 502 has at least one irregular surface. Referring to FIG. 6, cavity 502 has an irregular bottom surface 508. The irregular bottom surface 508 has contours that shape the encapsulant material as it is hardened around the LED devices. When the encapsulant has been cured, the devices can be removed. The resulting encapsulant will have a textured top surface. The mold device 500 allows for encapsulants to be placed onto several LEDs and cured simultaneously. Each encapsulant formed using the mold will have a textured top surface. The inner surfaces of the cavities 502 can be roughened according to particular specifications to achieve a particular textured surface on the resulting molded encapsulants. The surface may have average peak-to-valley distances ranging from a few micrometers to several hundred micrometers, with an acceptable range being 1-200 micrometers.

FIG. 7 shows a cavity 700 that comprises multiple irregular surfaces 702. Multiple LED chips 704 can be enveloped under a common encapsulant as shown. The LED chips 704 are shown disposed adjacent to the cavity 700. The encapsulant material 706 is injected into the cavity 700 and cured. The resulting encapsulant has three textured surfaces that mirror the irregular surfaces 702 of the cavity 700. In some embodiments, the various surfaces may have different finishes. As discussed above the roughened encapsulant helps to improve light extraction and color temperature uniformity of the packaged LED devices.

FIG. 8 is a cross-sectional view of an embodiment of an LED package device 800. An LED chip 802 is disposed on a mount surface 804 which can be part of a package. First and second electrodes 806, 808 are arranged to provide a bias to the LED chip 802. In this particular embodiment, both of the electrodes 806, 808 are accessible from the side of the device 800 which is opposite from the primary emission surface. Vias 810 provide a path for current to travel from the bottom side of the mount surface 804 up to the LED chip 802. The second electrode 808 can be connected to the LED chip 802 with a wire bond (not shown).

An encapsulant 812 is disposed over the LED chip 802, the mount surface 804, and the electrodes 806, 808. The encapsulant 812 is flat, providing a primary emission surface 814 that is parallel to the mount surface 804. Some light may escape from encapsulant surfaces other than the primary emission surface 814 such as the side surfaces. In other embodiments these surfaces can also be modified by roughening. A mold similar to the one shown in FIG. 6 may be used to deposit the encapsulant 812 onto a chip package. Using a mold allows for many LED device packages to be encapsulated simultaneously. The devices can then be singulated by dicing or by other separation techniques known in the art. In other embodiments, an encapsulant having an emission surface that is conformal with all of the chip package components may be deposited over the device.

Light is emitted from the LED chip 802 and interacts with the encapsulant 812. The primary emission surface 814 can be modified to improve light extraction and color temperature uniformity as discussed in detail above. If manufactured using a mold, for example, the surface 814 may comprise roughening features corresponding to the internal surfaces of the mold. The mount surface 804 and electrodes 806, 808 may comprise a reflective material (e.g., diffuse, specular, or a combination of both) so that light that is internally reflected is redirected back towards surface 814 for a second pass at emission. The LED package device 800 represents one of many packages that may be manufactured to include a flat encapsulant.

Although the present invention has been described in detail with reference to certain preferred configurations thereof, other versions are possible. Therefore, the spirit and scope of the invention should not be limited to the versions described above.

We claim:

1. A light emitting diode (LED) device, comprising:
    first and second electrodes, said first electrode comprising a first top surface, said first and second electrodes are accessible for electrical connection from a side of the LED device opposite said primary emission surface;

a substrate comprising one or more vias, wherein said one or more vias provide a path for current to travel from said side of the LED device opposite said primary emission surface;

a plurality of LED chips entirely on said first top surface; and an encapsulant disposed proximate to said mount surface, said encapsulant comprising a textured primary emission surface and at least one side emission surface;

wherein all of said first top surface is covered by said encapsulant and wherein said plurality of LED chips and said encapsulant are configured such that light can be emitted from said LED device from said at least one side emission surface;

wherein all of a top surface of said substrate adjacent to said encapsulant is covered by at least a portion of said encapsulant such that said encapsulant extends to the edges of said top surface of said substrate.

2. The LED device of claim 1, wherein said plurality of LED chips comprises LED chips emitting at least two different spectra of light.

3. The LED device of claim 2, said plurality of LED chips comprising LED chips emitting a red spectrum, LED chips emitting a green spectrum, and LED chips emitting a blue spectrum.

4. The LED device of claim 2, said plurality of LED chips comprising LED chips emitting a red spectrum and LED chips emitting a white spectrum.

5. The LED device of claim 2, said plurality of LED chips comprising LED chips emitting a blue spectrum and LED chips emitting a yellow spectrum.

6. The LED device of claim 2, wherein said plurality of LED chips is arranged in a substantially linear array.

7. The LED device of claim 1, wherein said first top surface comprises a reflective material.

8. The LED device of claim 7, wherein said reflective material forms a specular reflector.

9. The LED device of claim 7, wherein said reflective material forms a diffuse reflector.

10. The LED device of claim 7, wherein said reflective material forms a combination of specular and diffuse reflectors.

11. The LED device of claim 7, wherein said reflective material has light scattering properties.

12. The LED device of claim 1, wherein said textured primary emission surface comprises additive features.

13. The LED device of claim 1, wherein said textured primary emission surface comprises subtractive features.

14. The LED device of claim 1, wherein said encapsulant forms an interface with an ambient medium such that that index of refraction differential at said interface is at least 0.4.

15. The LED device of claim 1, wherein said textured primary emission surface has an average peak-to-valley roughness of 1-50 micrometers.

16. The LED device of claim 15, wherein said textured primary emission surface has an average peak-to-valley roughness ranging from 50-200 micrometers.

17. The LED device of claim 1, wherein said encapsulant comprises a wavelength conversion material.

18. The LED device of claim 1, wherein said encapsulant comprises phosphors.

19. The LED device of claim 1, wherein said encapsulant adheres directly to said LED chips and said first top surface.

20. The LED device of claim 1, wherein said encapsulant is attached to said LED chips with an adhesive epoxy.

21. The LED device of claim 1, wherein said textured emission surface has a patterned texture.

22. The LED device of claim 1, wherein said textured emission surface has a random texture.

23. The LED device of claim 1, said at least one side emission surface comprising a textured surface.

24. The LED device of claim 23, wherein said primary emission surface and said at least one side emission surface have different textures.

25. The LED device of claim 1, wherein said encapsulant has a thickness ranging from 70-200 micrometers.

26. The LED device of claim 1, wherein said first top surface is reflective.

27. The LED device of claim 1, wherein said second electrode comprises a second top surface; and wherein all of said second top surface is covered by said encapsulant.

28. The LED device of claim 27, wherein said first and second top surfaces are reflective.

* * * * *